(12) United States Patent
Zhu

(10) Patent No.: US 11,871,502 B2
(45) Date of Patent: Jan. 9, 2024

(54) DISPLAY MODULE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Cuilin Zhu, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 179 days.

(21) Appl. No.: 17/441,298

(22) PCT Filed: Jul. 9, 2021

(86) PCT No.: PCT/CN2021/105369
§ 371 (c)(1),
(2) Date: Sep. 21, 2021

(87) PCT Pub. No.: WO2022/257216
PCT Pub. Date: Dec. 15, 2022

(65) Prior Publication Data
US 2023/0254961 A1    Aug. 10, 2023

(30) Foreign Application Priority Data

Jun. 9, 2021    (CN) .......................... 202110643209.X

(51) Int. Cl.
*H05F 3/00*    (2006.01)
*H10K 50/00*    (2023.01)
*H05F 3/02*    (2006.01)

(52) U.S. Cl.
CPC .................. *H05F 3/00* (2013.01); *H05F 3/02* (2013.01); *H10K 50/00* (2023.02)

(58) Field of Classification Search
CPC .......... H05F 3/00; H05K 1/0259; H05K 9/00; H05K 9/0067; H05K 9/0066; H05K 9/0064; H05K 9/0079
USPC .................................................. 361/212, 220
See application file for complete search history.

(56) References Cited

U.S. PATENT DOCUMENTS

2015/0230331 A1\*  8/2015  Lee ...................... H05K 1/0259
                                                    361/220
2022/0210933 A1\*  6/2022  Park ......................... B32B 7/05
2022/0310979 A1\*  9/2022  Li ........................... H10K 59/126

\* cited by examiner

*Primary Examiner* — Danny Nguyen

(57) ABSTRACT

A display module is disclosed. The display module includes: a display panel body; a backplate; a composite functional layer disposed on a back side of the backplate; and an electrostatic discharging part including an electrostatic conductive element and an electrostatic discharging element connected to the electrostatic conductive element. Wherein, the electrostatic conductive element is in contact with the display panel body and/or the backplate, and the electrostatic discharging element is in electrical contact with the metal layer of the composite functional layer. Therefore, fluctuations of driving voltages caused by static electricity can be eliminated.

17 Claims, 5 Drawing Sheets

DISPLAY MODULE

RELATED APPLICATIONS

This application is a National Phase of PCT Patent Application No. PCT/CN2021/105369 having International filing date of Jul. 9, 2021, which claims the benefit of priority of Chinese Patent Application No. 202110643209.X filed on Jun. 9, 2021. The contents of the above applications are all incorporated by reference as if fully set forth herein in their entirety.

FIELD AND BACKGROUND OF THE INVENTION

The present disclosure relates to the field of display technologies, and more particularly, to a display module.

In modern communication industry, market demands for products such as mobile phones, TVs, tablets, notebooks, and digital cameras are increasing, and various display devices are also developing towards high quality and high requirements. In manufacture of flexible display modules, there are multiple laminating and film-tearing processes. As shown in FIG. 1, FIG. 1 shows a static electricity generation process of a display module. In the laminating and film-tearing processes, it will generate static electricity both during material film-tearing and laminating by roller rolling, so it will generate static electricity both when a display panel 30 and a film layer 31 are changed from a lamination state to a detached state and from the detached state to the lamination state. Static electricity will be stored on the display panel 30, and when the display panel displays pictures, a channeling effect will occur, which will cause fluctuations of driving voltages, thereby causing display pictures to have uneven brightness and local chromatic aberration.

Technical problem: an embodiment of the present disclosure provides a display module, which includes: a display panel body including a substrate and a display functional layer disposed on the substrate; a backplate disposed on a back side of the display panel body; a composite functional layer disposed on a back side of the backplate and at least including a metal layer; and an electrostatic discharging part including an electrostatic conductive element and an electrostatic discharging element connected to the electrostatic conductive element; Wherein, the electrostatic conductive element is in contact with the display panel body and/or the backplate, and the electrostatic discharging element is in electrical contact with the metal layer of the composite functional layer. The embodiment of the present disclosure disposes the electrostatic discharging part between the display panel body and/or the backplate and the metal layer, and the electrostatic discharging part connects the display panel body and/or the backplate to the metal layer, so static electricity on the display panel body and/or the backplate can be discharged to the metal layer. Therefore, problems of fluctuations of driving voltages caused by static electricity, uneven brightness of the display pictures, and local chromatic aberration can be solved.

SUMMARY OF THE INVENTION

An embodiment of the present disclosure provides a display module, which includes:
a display panel body including a substrate and a display functional layer disposed on the substrate;
a backplate disposed on a back side of the display panel body;
a composite functional layer disposed on a back side of the backplate and at least including a metal layer; and
an electrostatic discharging part including an electrostatic conductive element and an electrostatic discharging element connected to the electrostatic conductive element;
Wherein, the electrostatic conductive element is in contact with the display panel body and/or the backplate, and the electrostatic discharging element is in electrical contact with the metal layer of the composite functional layer.

Optionally, in some embodiments of the present disclosure, the metal layer is disposed on an outer layer of the composite functional layer away from the substrate, and the electrostatic discharging element overlaps an outer surface of the metal layer.

Optionally, in some embodiments of the present disclosure, the composite functional layer includes a first opening, and the electrostatic conductive element is in contact with the backplate by the first opening.

Optionally, in some embodiments of the present disclosure, the backplate includes a second opening, and an orthographic projection of the first opening on the substrate covers an orthographic projection of the second opening on the substrate; and
the electrostatic conductive element is in contact with the display panel body by the first opening and the second opening.

Optionally, in some embodiments of the present disclosure, a length of the second opening is less than a length of the first opening.

Optionally, in some embodiments of the present disclosure, the electrostatic discharging part is filled in the first opening and the second opening, or disposed on side walls of the first opening and the second opening.

Optionally, in some embodiments of the present disclosure, the composite functional layer includes:
foam disposed on one side of the metal layer adjacent to the substrate; and
an adhesive layer disposed on one side of the foam adjacent to the substrate;
wherein the first opening penetrates through the metal layer, the foam, and the adhesive layer.

Optionally, in some embodiments of the present disclosure, the electrostatic discharging part is a conductive glue.

Optionally, in some embodiments of the present disclosure, the display panel body includes a first display part and a second display part, a transmittance of the first display part is greater than a transmittance of the second display part, and the first opening is disposed corresponding to the first display part.

Optionally, in some embodiments of the present disclosure, the conductive glue is a black conductive glue and is disposed on side walls of the first opening, or the conductive glue is a transparent conductive glue and is filled in the first opening.

Beneficial effect: the embodiment of the present disclosure provides the display module, which is provided with the electrostatic discharging part that connects the display panel body and/or the backplate to the metal layer, so static electricity on the display panel body and/or the backplate can be discharged to the metal layer. Therefore, fluctuations of driving voltages caused by static electricity can be eliminated, thereby improving brightness uniformity of the display module and local chromatic aberration.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

DESCRIPTION OF SPECIFIC EMBODIMENTS OF THE INVENTION

Figure 1:
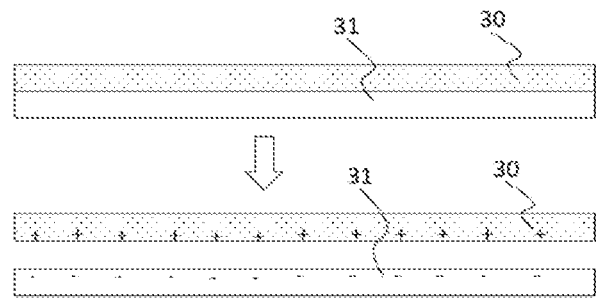
FIG. 1 is a schematic diagram of a static electricity generation process of a display module according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device.

An embodiment of the present disclosure provides a display module. The display module includes: a display panel body including a substrate and a display functional layer disposed on the substrate; a backplate disposed on a back side of the display panel body; a composite functional layer disposed on a back side of the backplate and at least including a metal layer; and an electrostatic discharging part including an electrostatic conductive element and an electrostatic discharging element connected to the electrostatic conductive element. Wherein, the electrostatic conductive element is in contact with the display panel body and/or the backplate, and the electrostatic discharging element is in electrical contact with the metal layer of the composite functional layer.

The embodiments of the present disclosure provide the display module. They are described in detail in the following. It should be noted that an order of description in the following embodiments is not meant to limit a preferred order of the embodiments.

Embodiment 1

Figure 2:
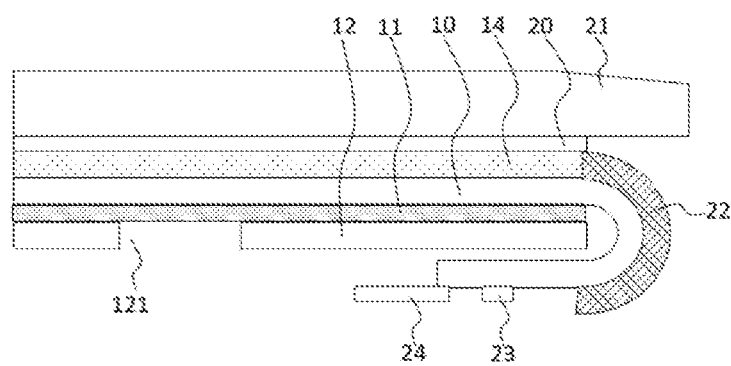
FIG. 2 is a first schematic diagram of a display module before being provided with an electrostatic discharging part according to an embodiment of the present disclosure.
Figure 3:
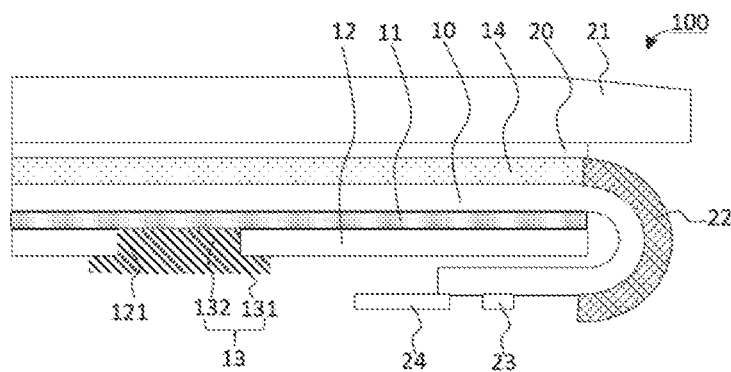
FIG. 3 is a first schematic diagram of the display module after being provided with the electrostatic discharging part according to an embodiment of the present disclosure.
Figure 4:
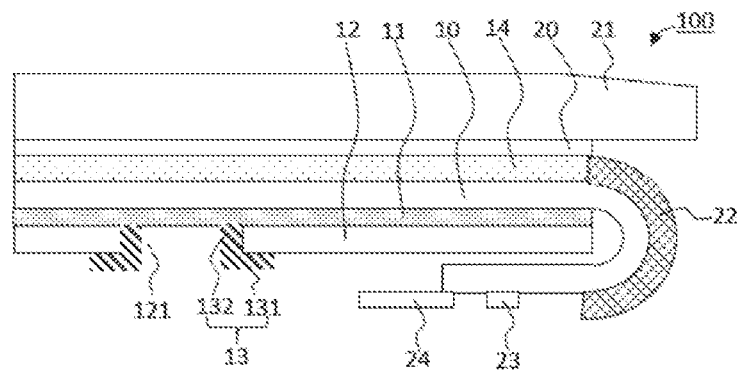
FIG. 4 is a second schematic diagram of the display module after being provided with the electrostatic discharging part according to an embodiment of the present disclosure.

Referring to FIGS. 2 to 4, FIG. 2 is a first schematic diagram of the display module before being provided with an electrostatic discharging part according to an embodiment of the present disclosure, FIG. 3 is a first schematic diagram of the display module after being provided with the electrostatic discharging part according to an embodiment of the present disclosure, and FIG. 4 is a second schematic diagram of the display module after being provided with the electrostatic discharging part according to an embodiment of the present disclosure.

This embodiment provides the display module, which includes the display panel body 10, the backplate 11, the composite functional layer 12, and the electrostatic discharging part 13. The display panel body 10 includes the substrate and the display functional layer (not shown in the figure) disposed on the substrate. The backplate is disposed on the back side of the display panel body 10. The composite functional layer 12 is disposed on the back side of the backplate 11 and at least includes the metal layer. The electrostatic discharging part 13 includes the electrostatic conductive element 132 and the electrostatic discharging element 131 connected to the electrostatic conductive element 132. Wherein, the electrostatic conductive element 132 is in contact with the display panel body 10 and/or the backplate 11, and the electrostatic discharging element 131 is in electrical contact with the metal layer of the composite functional layer 12.

Further, the metal layer is disposed on an outer layer of the composite functional layer 12 away from the substrate, and the electrostatic discharging element 131 overlaps an outer surface of the metal layer.

Further, the composite functional layer 12 includes a first opening 121, and the electrostatic conductive element 132 is in contact with the backplate 11 by the first opening 121.

Specifically, the composite functional layer 12 may be a heat dissipation composite film (super clean foam, SCF), which has functions of heat dissipation and stress buffering.

Figure 5:
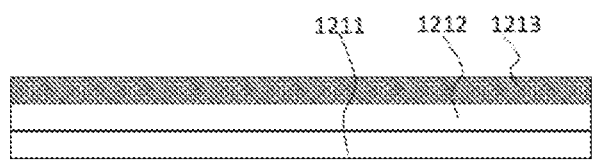
FIG. 5 is a first schematic structural diagram of a composite functional layer according to an embodiment of the present disclosure.

Further, referring to FIGS. 2 and 5, FIG. 5 shows a structure of the composite functional layer 12, which includes the metal layer 1211, foam 1212, and an adhesive layer 1213. The foam 1212 is disposed on one side of the metal layer adjacent to the substrate, and the adhesive layer 1213 is disposed on one side of the foam 1212 adjacent to the substrate. Wherein, the first opening 121 penetrates through the metal layer 1211, the foam 1212, and the adhesive layer 1213. In FIG. 5, the composite functional layer 12 includes the adhesive layer 1213, the foam 1212, and the metal layer 1211 adjacent to the backplate 11 in sequence, and the metal layer 1211 is disposed on an outer surface of the composite functional layer 12. A material of the metal layer 1211 may be copper foil, stainless steel, etc.

Figure 6:
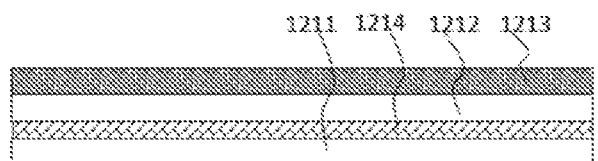
FIG. 6 is a second schematic structural diagram of the composite functional layer according to an embodiment of the present disclosure.

In addition, referring to FIG. 6, FIG. 6 shows another structure of the composite functional layer 12, which further includes a first buffer layer 1214. The composite functional layer 12 includes the adhesive layer 1213, the foam 1212, the first buffer layer 1214, and the metal layer 1211 adjacent to the backplate 11 in sequence, and the metal layer 1211 is disposed on the outer surface of the composite functional layer 12. A material of the first buffer layer 1214 may be polyimide (PI) or other materials. The material of the metal layer 1211 may be copper foil, stainless steel, etc.

Figure 7:
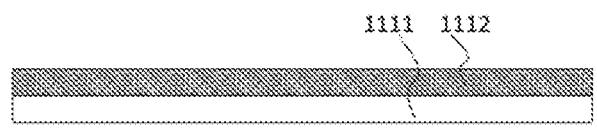
FIG. 7 is a schematic structural diagram of a backplate according to an embodiment of the present disclosure.

Referring to FIG. 7, FIG. 7 shows a structure of the backplate 11. The backplate 11 may include an adhesive glue layer 1112 and a second buffer layer 1111, and a material of the second buffer layer 1111 may be polyethylene terephthalate (PET). The adhesive glue layer 1112 is disposed on one side of the second buffer layer 1111 adjacent to the substrate.

Further, the electrostatic discharging part 13 is a conductive glue. The conductive glue may be a conductive silver glue.

Further, the electrostatic discharging part 13 is filled in the first opening 121 or is disposed on side walls of the first opening 121. As shown in FIG. 3, the electrostatic discharging part 13 is the conductive glue and is filled in the first opening 121. As shown in FIG. 4, the electrostatic discharging part 13 is the conductive glue and is disposed on the side walls of the first opening 121. For example, the conductive glue is disposed on the side walls of the first opening 121 by coating or inkjet printing.

Specifically, the electrostatic conductive element 132 of the electrostatic discharging part 13 is filled in the first opening 121 or is disposed on the side walls of the first opening 121, and the electrostatic discharging element 131 of the electrostatic discharging part 13 is in contact with the metal layer 1211.

Specifically, in some embodiments, the metal layer 1211 is disposed on the outer layer of the composite functional layer 12 away from the substrate, and the electrostatic discharging element 131 overlaps the outer surface of the metal layer 1211. That is, a thickness of the electrostatic discharging part 13 is greater than a height of the first opening 121, and the electrostatic discharging element 131 of the electrostatic discharging part 13 extends to the outer surface of the metal layer 1211 from the first opening 121, thereby forming an electrical contact. For example, the electrostatic discharging part 13 is the conductive glue, and a thickness of the conductive glue is 50 um to 100 um higher than the outer surface of the metal layer 1211.

Figure 8:
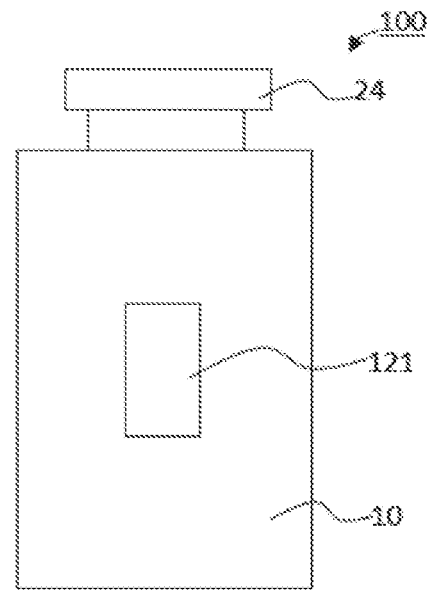
FIG. 8 is a schematic diagram of a location setting of a first opening according to an embodiment of the present disclosure.

Further, referring to FIG. 8, FIG. 8 shows a location setting of the first opening 121. The first opening 121 may be disposed on a middle part or an edge part of a back side of the display module 100. A shape of the first opening 121 is not limited to rectangular, square, circular, or trapezoidal.

Referring to FIGS. 2 and 3, a layer structure of the display module 100 includes the display functional layer disposed on the substrate, the backplate 11, and the composite functional layer 12 in sequence. The composite functional layer 12 is provided with the first opening 121, and the electrostatic discharging part 13 is disposed in the first opening 121. In film-tearing and laminating processes of the display module 100, the backplate 11 will generate static electricity. The embodiment of the present disclosure can discharge the static electricity of the backplate 11 to the metal layer 1211 by the electrostatic discharging part 13, so fluctuations of driving voltages caused by static electricity can be eliminated, thereby improving brightness uniformity of the display module and local chromatic aberration.

It should be noted that the display module 100 may include or may be electrically connected to a drive chip 23 and a circuit board 24. The display functional layer of the display panel body 10 may also include a polarizer 14, an optical adhesive layer 20 (such as OCA or OCR), and a protective coverplate 21 (such as a cover glass). The display module 100 may also have a bending structure of a flexible substrate, and a protective glue material 22 is coated on a bending part. Although the structure of the display module 100 is exemplarily described, it is not limited to these structures.

Embodiment 2

Figure 9:
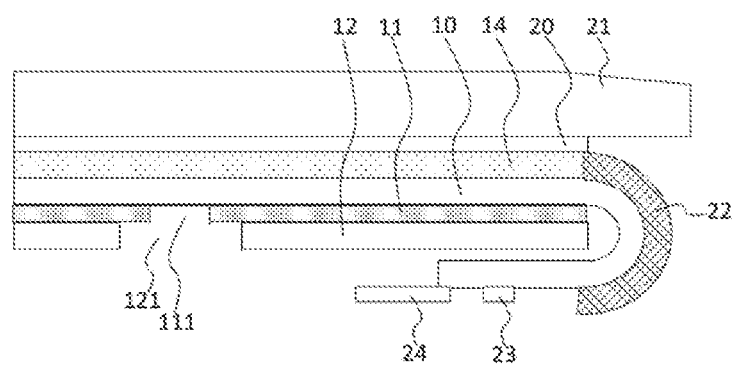
FIG. 9 is a second schematic diagram of the display module before being provided with the electrostatic discharging part according to an embodiment of the present disclosure.
Figure 10:
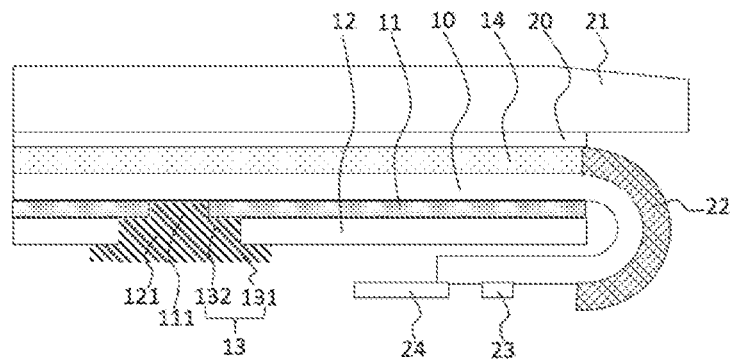
FIG. 10 is a third schematic diagram of the display module after being provided with the electrostatic discharging part according to an embodiment of the present disclosure.
Figure 11:
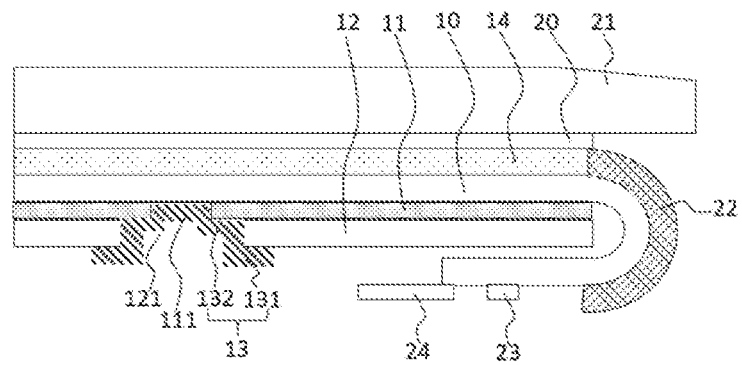
FIG. 11 is a fourth schematic diagram of the display module after being provided with the electrostatic discharging part according to an embodiment of the present disclosure.

Referring to FIGS. 9 to 11, FIG. 9 is a second schematic diagram of the display module before being provided with the electrostatic discharging part according to an embodiment of the present disclosure, FIG. 10 is a third schematic diagram of the display module after being provided with the electrostatic discharging part according to an embodiment of the present disclosure, and FIG. 11 is a fourth schematic diagram of the display module after being provided with the electrostatic discharging part according to an embodiment of the present disclosure.

This embodiment is same as or similar to embodiment 1, so the similarities will not be repeated, and a difference is that the display module 100 further includes a second opening 111.

Further, the backplate 11 includes the second opening 111, and an orthographic projection of the first opening 121 on the substrate covers an orthographic projection of the second opening 111 on the substrate. The electrostatic conductive element 132 is in contact with the display panel body by the first opening 121 and the second opening 111.

In some embodiments, shapes and sizes of the first opening 121 and the second opening 111 are the same, and the orthographic projection of the first opening 121 on the substrate overlaps the orthographic projection of the second opening 111 on the substrate. At this time, the disposition of the electrostatic discharging part 13 is same as that of embodiment 1, and static electricity on the substrate of the display panel body 10 can be conducted and discharged to the metal layer 1211 by the electrostatic discharging part 13, so the fluctuations of the driving voltages caused by static electricity can be eliminated, thereby improving the brightness uniformity of the display module and local chromatic aberration.

In some embodiments, the size of the first opening 121 is greater than the size of the second opening 111, and a length of the first opening 121 is greater than a length of the second opening 111. When the first opening 121 and the second opening 111 are circular, the lengths of the first opening 121 and the second opening 111 mean diameters of circles. At this time, the backplate 11 and the composite functional layer 12 corresponding to the first opening 121 and the second opening 111 form a step shape, and when the backplate 11 or the composite functional layer 12 has a thicker thickness, the first opening 121 or the second opening 111 has a higher height, so it is convenient for disposition of the electrostatic discharging part 13 by the step shape. For example, the electrostatic discharging part 13 is a conductive glue, and it is beneficial for the electrostatic discharging part 13 to be filled in the openings or to be disposed on the side walls of the first opening 121 and the second opening 111 more firmly by the step shape, thereby improving reliability of the disposition of the electrostatic discharging part 13.

Specifically, an area of the second opening 111 ranges from 4 mm$^2$ to mm$^2$, an area of the first opening 121 ranges from 6.25 mm 2 to 14 mm$^2$, and an area of the electrostatic discharging part 13 ranges from 12.5 mm 2 to 30 mm$^2$. The length of the first opening 121 is 0.5 mm to 1 mm larger than the length of the second opening 111, and a width of an overlapping area of the electrostatic discharging part 13 and the metal layer 1211 ranges from 1 mm to 2 mm. This embodiment optimally limits the sizes of the first opening 121, the second opening 111, and the electrostatic discharging part 13, which can ensure that the electrostatic discharging part 13 can discharge static electricity by sufficient connections and can have a smaller size at a same time, thereby reducing a thickness of the display module 100 and improving reliability.

Referring to FIG. 10, when the backplate 11 and the composite functional layer 12 corresponding to the first opening 121 and the second opening 111 form the step shape and the electrostatic discharging part 13 is the conductive glue, the step shape is beneficial for the electrostatic discharging part 13 to be filled in the openings more firmly, which increases a contact area between the conductive glue and the backplate 11 and the composite functional layer 12, and can prevent formation of bubbles in the second opening 111 at a same time, thereby improving the reliability of the disposition of the electrostatic discharging part 13.

Referring to FIG. 11, when the backplate 11 and the composite functional layer 12 corresponding to the first opening 121 and the second opening 111 form the step shape and the electrostatic discharging part 13 is the conductive glue, the step shape is beneficial for the electrostatic discharging part 13 to be disposed on the side walls of the first opening 121 and the second opening 111 more firmly, which increases contact areas between the conductive glue and the side walls and back surfaces of the backplate 11 and the side walls of the composite functional layer 12, thereby preventing the conductive glue from only directly connecting to the side walls of the first opening 121 and the second opening 111. Therefore, it can prevent the conductive glue from breaking, thereby improving the reliability of the disposition of the electrostatic discharging part 13.

Embodiment 3

Figure 12:
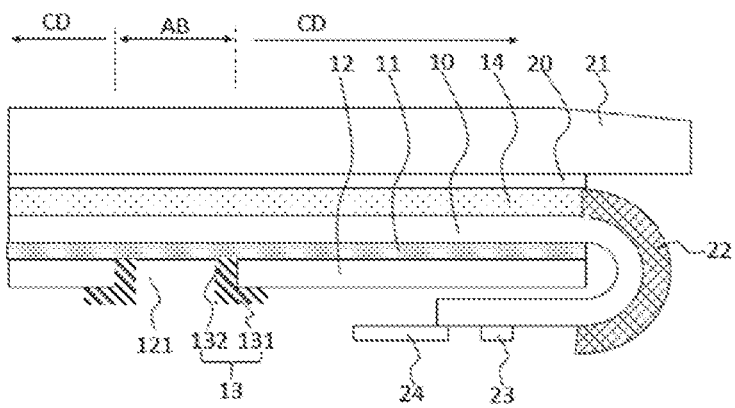
FIG. 12 is a fifth schematic diagram of the display module after being provided with the electrostatic discharging part according to an embodiment of the present disclosure.
Figure 13:
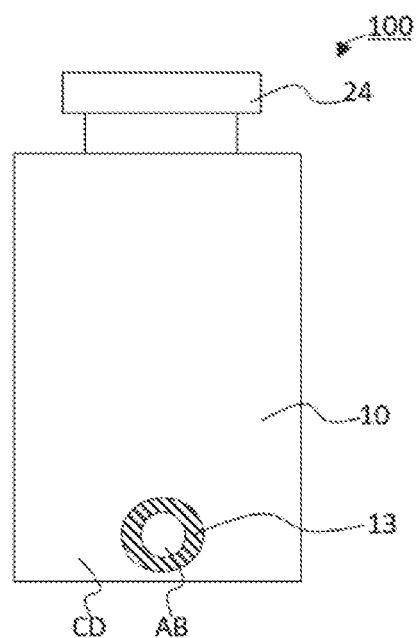
FIG. 13 is another schematic diagram of the location setting of the first opening according to an embodiment of the present disclosure.

Referring to FIGS. 12 and 13, FIG. 12 is a fifth schematic diagram of the display module after being provided with the electrostatic discharging part according to an embodiment of the present disclosure, and FIG. 13 is another schematic diagram of the location setting of the first opening 121 according to an embodiment of the present disclosure.

The display panel body 10 includes a first display part AB and a second display part CD, a transmittance of the first display part AB is greater than a transmittance of the second display part CD, and the first opening 121 is disposed corresponding to the first display part AB.

Specifically, the display panel body 10 includes the first display part AB and the second display part CD, the first display part AB is disposed corresponding to a sensor area, and the second display part CD is disposed corresponding to an area excluding sensors. The sensors may be optical sensors or infrared sensors, and the sensors may play a role of taking pictures for cameras, recognizing fingerprints for fingerprint recognition modules, and detecting ambient light for light sensor modules. Further, the embodiments are not limited to these. The sensors may be installed inside or outside the display panel body 10, For example, an integration setting of the fingerprint recognition modules and the display panel body 10 and a setting method of under-screen cameras.

Specifically, the transmittance of the first display part AB of the display panel body 10 corresponding to the sensors is greater than the transmittance of the second display part CD of other areas, so that light can pass through the display panel body 10 to reach the sensors, and the sensors can work.

Further, when the electrostatic discharging part 13 is the conductive glue, and the conductive glue is a black conductive glue, preferably, the black conductive glue is disposed on the side walls of the first opening 121, and a middle part of the first opening 121 is not filled with the black conductive glue, so that the light can pass through the middle part of the first opening 121 to reach the sensors, and the sensors can work. Also, the black conductive glue being disposed on the side walls of the first opening 121 can also prevent light leakage, thereby preventing display light from reaching the sensors to interfere with working of the sensors, and improving operation accuracy of the sensors.

Further, when the electrostatic discharging part 13 is the conductive glue, and the conductive glue is a transparent conductive glue, the transparent conductive glue can be disposed and filled in the first opening 121, and at this time, the light can pass through the first opening 121 to reach the sensors, and the sensors can work.

It should be noted that the disposition of the electrostatic discharging part 13 in this embodiment is same as or similar to that of the display module 100 in embodiments 1 and 2, a difference is that the display module 100 includes the first display part AB corresponding to the sensors, and the similarities will not be repeated. The display module 100 may also include the second opening 111. When the conductive glue is the black conductive glue, preferably, the black conductive glue is disposed on the side walls of the first opening 121 and the second opening 111. When the conductive glue is the transparent conductive glue, the transparent conductive glue can be disposed and filled in the first opening 121 and the second opening 111. The beneficial effects of disposing the electrostatic discharging part 13 are the same as that of embodiments 1 and 2, and will not be repeated herein.

The display module provided in the embodiments of the present disclosure is described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display module, comprising:
a display panel body comprising a substrate and a display functional layer disposed on the substrate;
a backplate disposed on a back side of the display panel body;
a composite functional layer disposed on a back side of the backplate and at least comprising a metal layer; and
an electrostatic discharging part comprising an electrostatic conductive element and an electrostatic discharging element connected to the electrostatic conductive element;
wherein the electrostatic conductive element is in contact with the backplate, and the electrostatic discharging element is in electrical contact with the metal layer of the composite functional layer,
wherein the metal layer is disposed on an outer layer of the composite functional layer away from the substrate, and the electrostatic discharging element overlaps an outer surface of the metal layer.

2. The display module according to claim 1, wherein the composite functional layer comprises a first opening, and the electrostatic conductive element is in contact with the backplate by the first opening.

3. The display module according to claim 2, wherein the backplate comprises a second opening, and an orthographic projection of the first opening on the substrate covers an orthographic projection of the second opening on the substrate; and
the electrostatic conductive element is in contact with the display panel body by the first opening and the second opening.

4. The display module according to claim 3, wherein a length of the second opening is less than a length of the first opening.

5. The display module according to claim 4, wherein the electrostatic discharging part is filled in the first opening and the second opening or disposed on side walls of the first opening and the second opening.

6. The display module according to claim 2, wherein the composite functional layer comprises:
foam disposed on one side of the metal layer adjacent to the substrate; and
an adhesive layer disposed on one side of the foam adjacent to the substrate;
wherein the first opening penetrates through the metal layer, the foam, and the adhesive layer.

7. The display module according to claim 3, wherein the composite functional layer comprises:
foam disposed on one side of the metal layer adjacent to the substrate; and
an adhesive layer disposed on one side of the foam adjacent to the substrate;
wherein the first opening penetrates through the metal layer, the foam, and the adhesive layer.

8. The display module according to claim 4, wherein the composite functional layer comprises:
foam disposed on one side of the metal layer adjacent to the substrate; and
an adhesive layer disposed on one side of the foam adjacent to the substrate;
wherein the first opening penetrates through the metal layer, the foam, and the adhesive layer.

9. The display module according to claim 2, wherein the electrostatic discharging part is a conductive glue.

10. The display module according to claim 3, wherein the electrostatic discharging part is a conductive glue.

11. The display module according to claim 4, wherein the electrostatic discharging part is a conductive glue.

12. The display module according to claim 9, wherein the display panel body comprises a first display part and a second display part, a transmittance of the first display part is greater than a transmittance of the second display part, and the first opening is disposed corresponding to the first display part.

13. The display module according to claim 10, wherein the display panel body comprises a first display part and a second display part, a transmittance of the first display part is greater than a transmittance of the second display part, and the first opening is disposed corresponding to the first display part.

14. The display module according to claim 11, wherein the display panel body comprises a first display part and a second display part, a transmittance of the first display part is greater than a transmittance of the second display part, and the first opening is disposed corresponding to the first display part.

15. The display module according to claim 12, wherein the conductive glue is a black conductive glue and is disposed on side walls of the first opening, or the conductive glue is a transparent conductive glue and is filled in the first opening.

16. The display module according to claim 13, wherein the conductive glue is a black conductive glue and is disposed on side walls of the first opening, or the conductive glue is a transparent conductive glue and is filled in the first opening.

17. The display module according to claim 14, wherein the conductive glue is a black conductive glue and is disposed on side walls of the first opening, or the conductive glue is a transparent conductive glue and is filled in the first opening.

* * * * *